(12) United States Patent
Lee et al.

(10) Patent No.: US 8,212,625 B2
(45) Date of Patent: Jul. 3, 2012

(54) DIFFERENTIAL VCO AND QUADRATURE VCO USING CENTER-TAPPED CROSS-COUPLING OF TRANSFORMER

(75) Inventors: Young Jae Lee, Daegu (KR); Cheon Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 44 days.

(21) Appl. No.: 12/867,798

(22) PCT Filed: Jun. 13, 2008

(86) PCT No.: PCT/KR2008/003331
§ 371 (c)(1),
(2), (4) Date: Aug. 16, 2010

(87) PCT Pub. No.: WO2009/104839
PCT Pub. Date: Aug. 27, 2009

(65) Prior Publication Data
US 2011/0032044 A1 Feb. 10, 2011

(30) Foreign Application Priority Data

Feb. 21, 2008 (KR) .................. 10-2008-0015749
May 13, 2008 (KR) .................. 10-2008-0043936

(51) Int. Cl.
*H03B 5/12* (2006.01)
*H03B 27/00* (2006.01)
*H03C 3/22* (2006.01)
(52) U.S. Cl. .... 331/117 FE; 331/45; 331/46; 331/177 V
(58) Field of Classification Search ............... 331/36 C, 331/45, 46, 117 FE, 117 R, 167, 177 V
See application file for complete search history.

(56) References Cited

U.S. PATENT DOCUMENTS 5,912,596 A    6/1999  Ghoshal (Continued)

FOREIGN PATENT DOCUMENTS

| KR | 2005-0034344 A | 4/2005 |
|---|---|---|
| KR | 2005-0034345 A | 4/2005 |
| KR | 2007-0042135 A | 4/2007 |

OTHER PUBLICATIONS

Seok-Ju Yun et al., "A 1mW Current-Reuse CMOS Differential LC-VCO with Low Phase Noise", 2005 IEEE International Solid-State Circuits Conference, Session 29, RF Techniques 29.6, Feb. 9, 2005, pp. 540-541, 616.

(Continued)

*Primary Examiner* — Levi Gannon
(74) *Attorney, Agent, or Firm* — Rabin & Berdo, P.C.

(57) ABSTRACT

Provided are a differential voltage-controlled oscillator (VCO) and a quadrature VCO using center-tapped cross-coupling of a transformer. The differential VCO and the quadrature VCO can be driven by low power through a current reuse structure and have an excellent phase noise characteristic by center-tapped cross-coupling through a transformer. Further, variable capacitance units for frequency variation are divided into variable capacitance units for coarse tuning and variable capacitance units for fine tuning. Therefore, it is possible to obtain a wide tuning range while voltage oscillation gain is reduced. Further, the differential VCO and the quadrature VCO are configured in such a manner that the respective variable capacitance units operate linearly throughout the entire capacitance region due to control voltage distribution by resistors. Accordingly, it is possible to obtain a linear control voltage-oscillation frequency characteristic. The quadrature VCO according to the present invention can output four-phase quadrature signals while having an excellent phase noise characteristic, without substrate loss and current consumption caused by the switching transistors.

15 Claims, 7 Drawing Sheets

U.S. PATENT DOCUMENTS

| | | | |
|---|---|---|---|
| 6,121,850 | A | 9/2000 | Ghoshal |
| 6,456,167 | B1 | 9/2002 | Huang |
| 6,621,363 | B2 | 9/2003 | Park et al. |
| 6,639,481 | B1 | 10/2003 | Ravi et al. |
| 6,911,870 | B2 | 6/2005 | Gierkink et al. |
| 6,982,605 | B2 | 1/2006 | Mondal et al. |
| 7,145,409 | B2 | 12/2006 | Lee et al. |
| 7,154,349 | B2 | 12/2006 | Cabanillas |
| 7,239,209 | B2 * | 7/2007 | Adan .................. 331/117 R |
| 7,245,190 | B2 | 7/2007 | Copani et al. |
| 7,420,429 | B2 * | 9/2008 | Cha et al. .................. 331/46 |
| 7,532,001 | B2 * | 5/2009 | Lee et al. .................. 324/127 |
| 7,545,230 | B2 * | 6/2009 | Jang et al. .................. 331/177 V |
| 7,551,038 | B2 * | 6/2009 | Jang et al. .................. 331/45 |
| 7,592,875 | B2 * | 9/2009 | Maget et al. .................. 331/46 |
| 7,679,465 | B2 * | 3/2010 | Aspemyr et al. .......... 331/117 FE |

OTHER PUBLICATIONS

KaChun Kwok et al., "Ultra-Low-Voltage High-Performance CMOS VCOs Using Transformer Feedback", IEEE Journal of Solid-State Circuits, vol. 40, No. 3, Mar. 2005, pp. 652-660.

Alan W. L. Ng et al., "A 1-V 17-GHz 5-mW CMOS Quadrature VCO Based on Transformer Coupling", IEEE Journal of Solid-State Circuits, vol. 42, No. 9, Sep. 2007, pp. 1933-1941.

Hsien-Ku Chen et al., "A Low Phase-Noise 9-GHz CMOS Quadrature-VCO using Novel Source-Follower Coupling Technique", Microwave Symposium, 2007. IEEE/MTT-S International, Jun. 2007, pp. 851-854.

S.-L. Jang et al., "A Technique to Reduce the Turn-On Time of VCO by the Tranient Body-Bias", Department of Electronic Engineering National Taiwan University of Science and Technology, 2005.

* cited by examiner

[Fig. 1] PRIOR ART
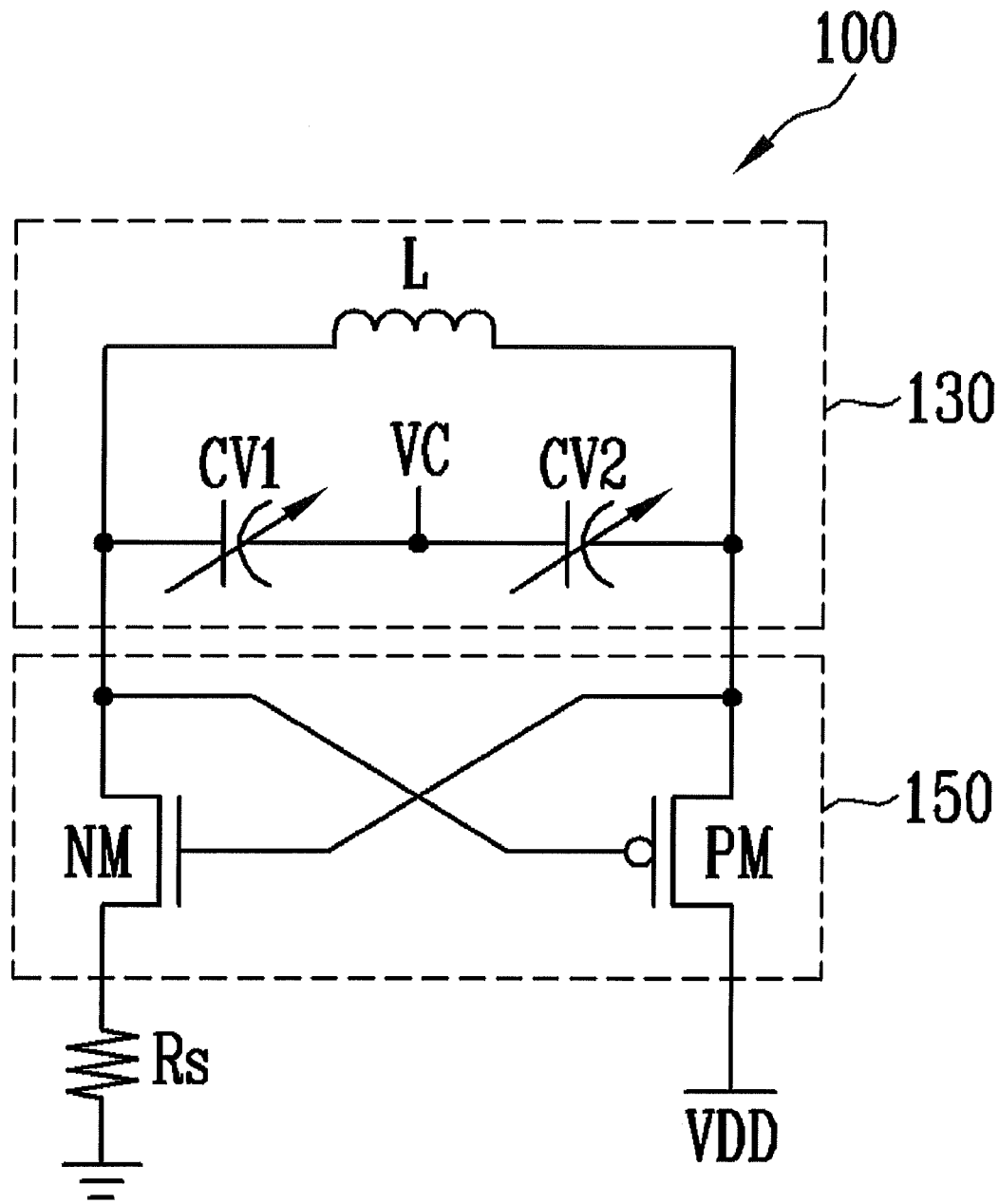

[Fig. 2]
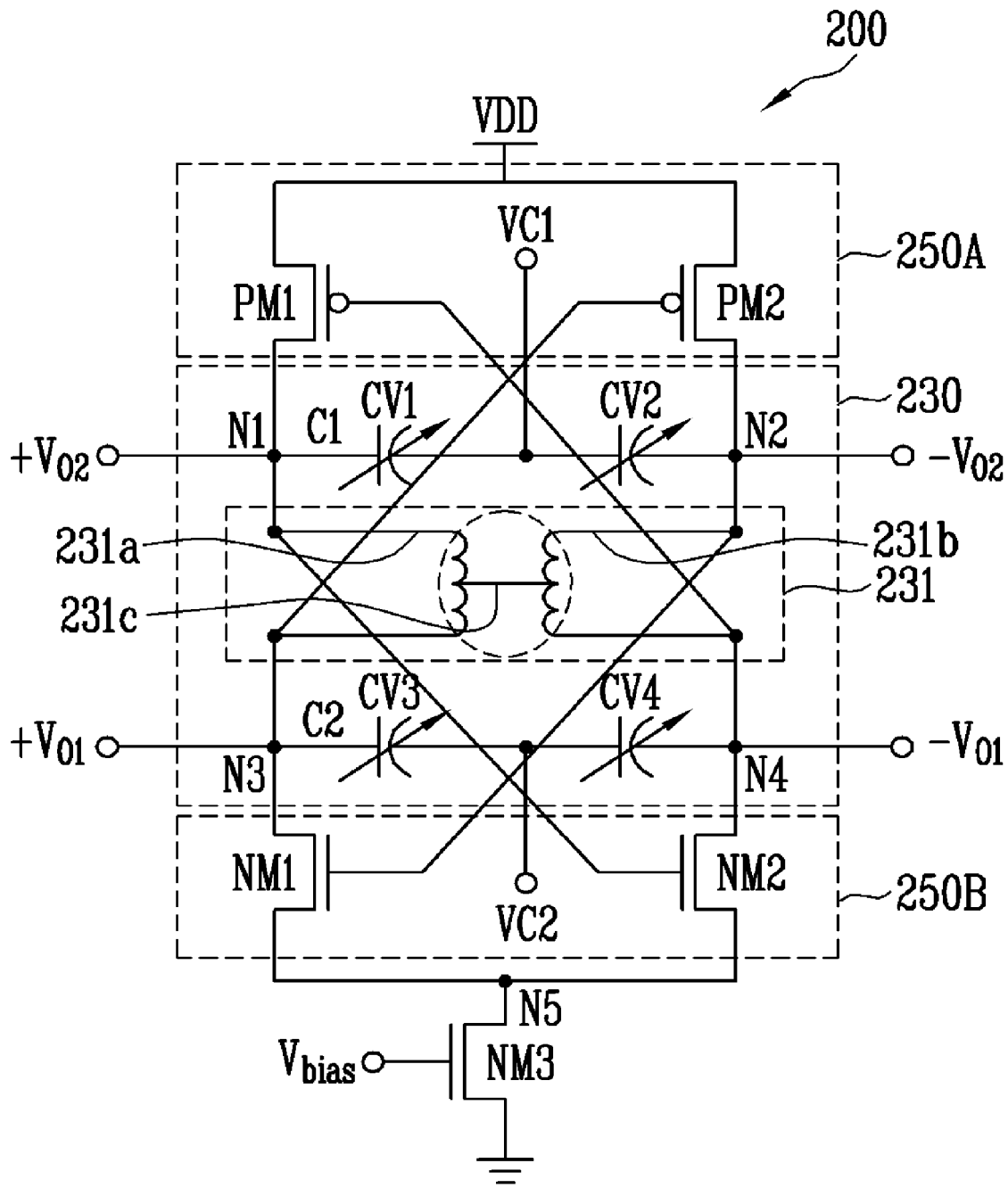

[Fig. 3]
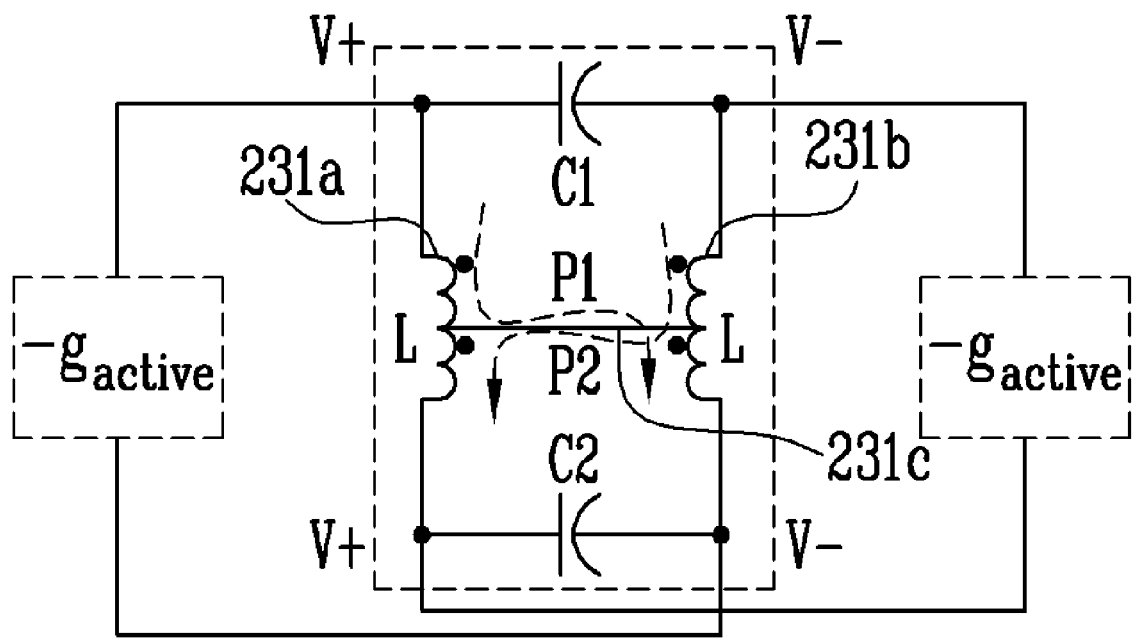

[Fig. 4]
(a) 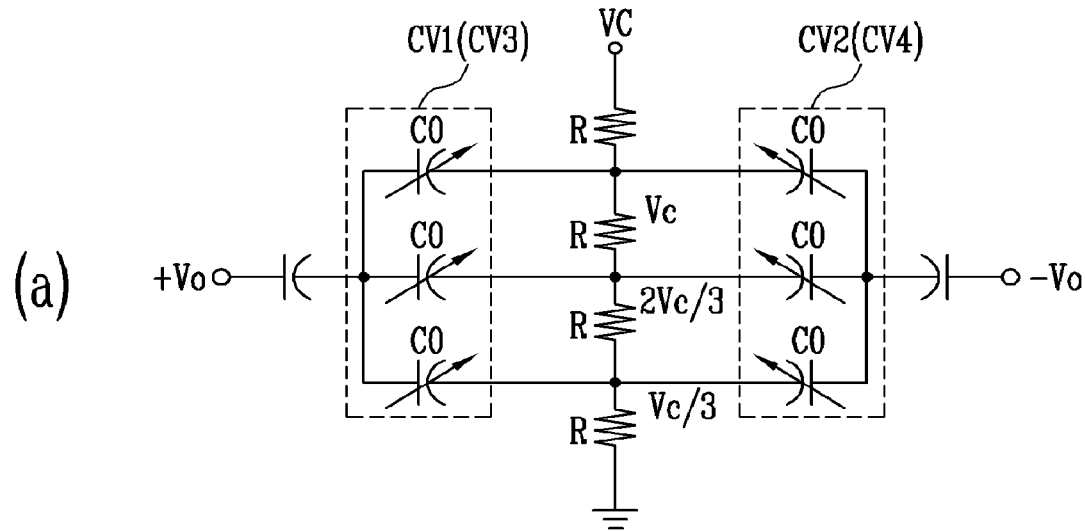
(b) 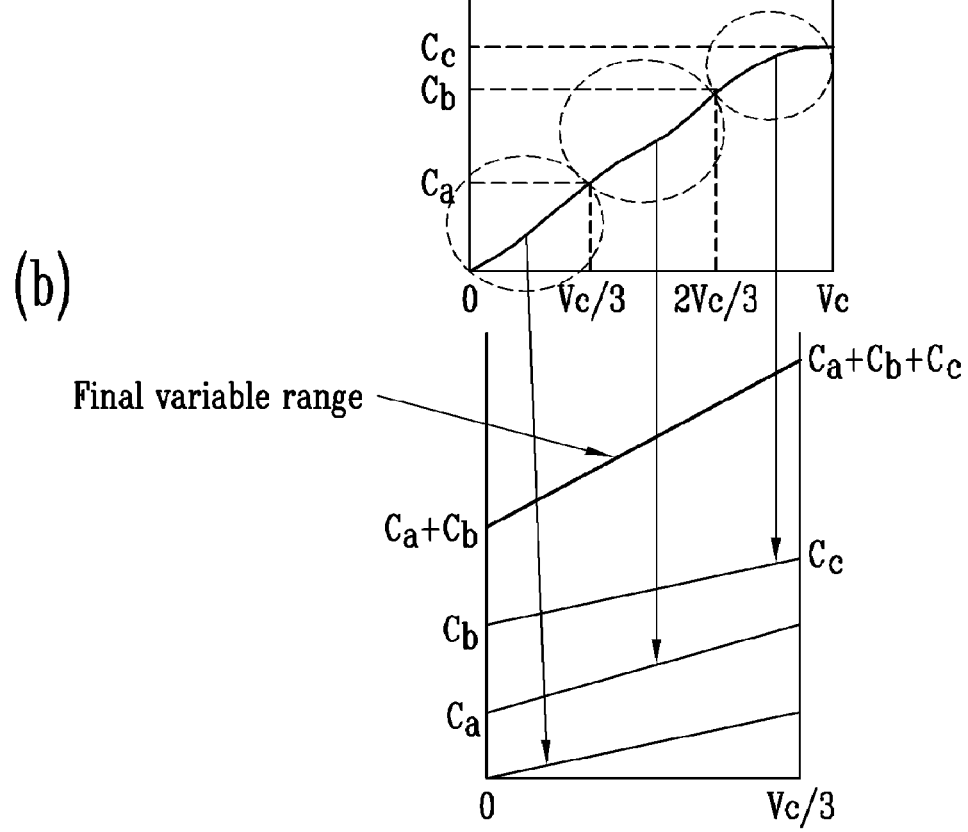

[Fig. 5]
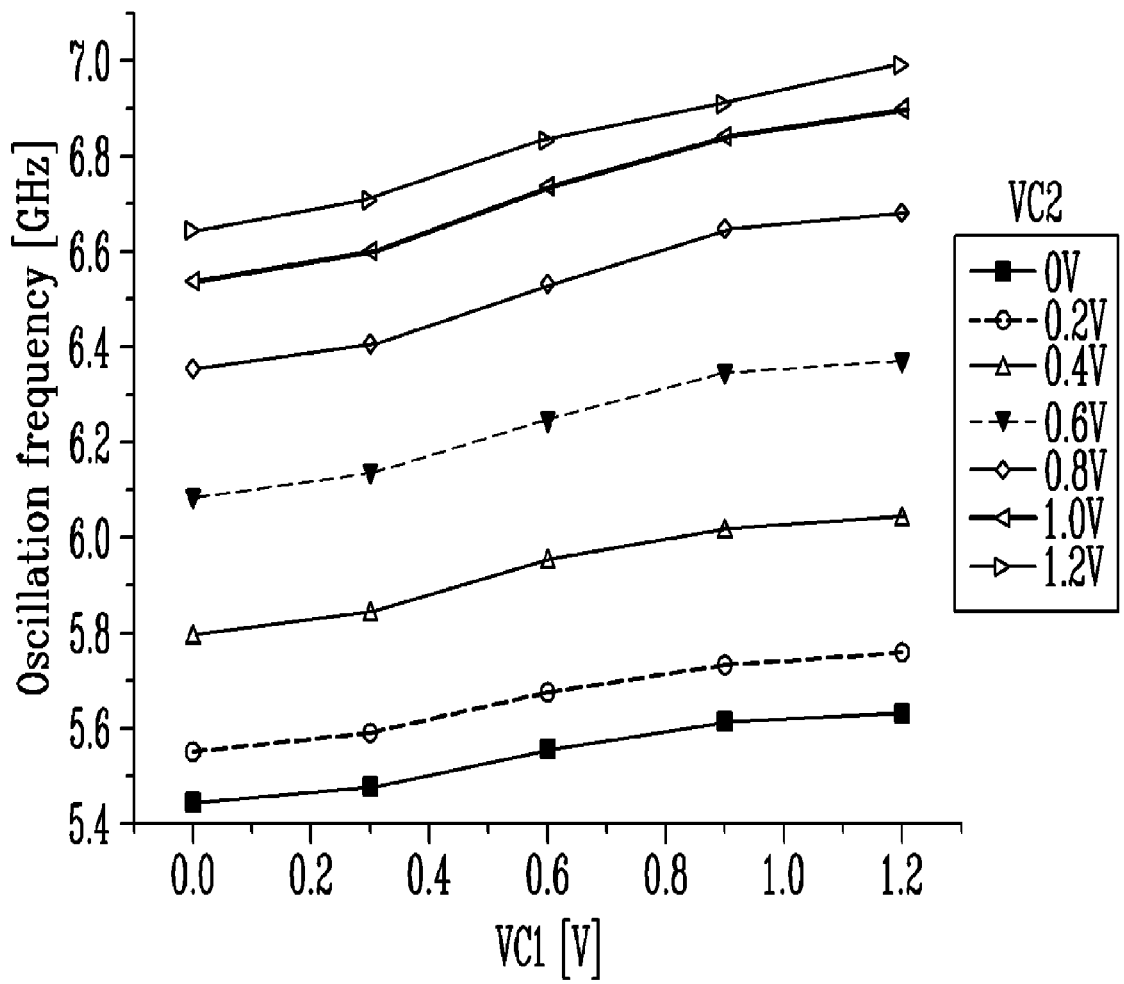

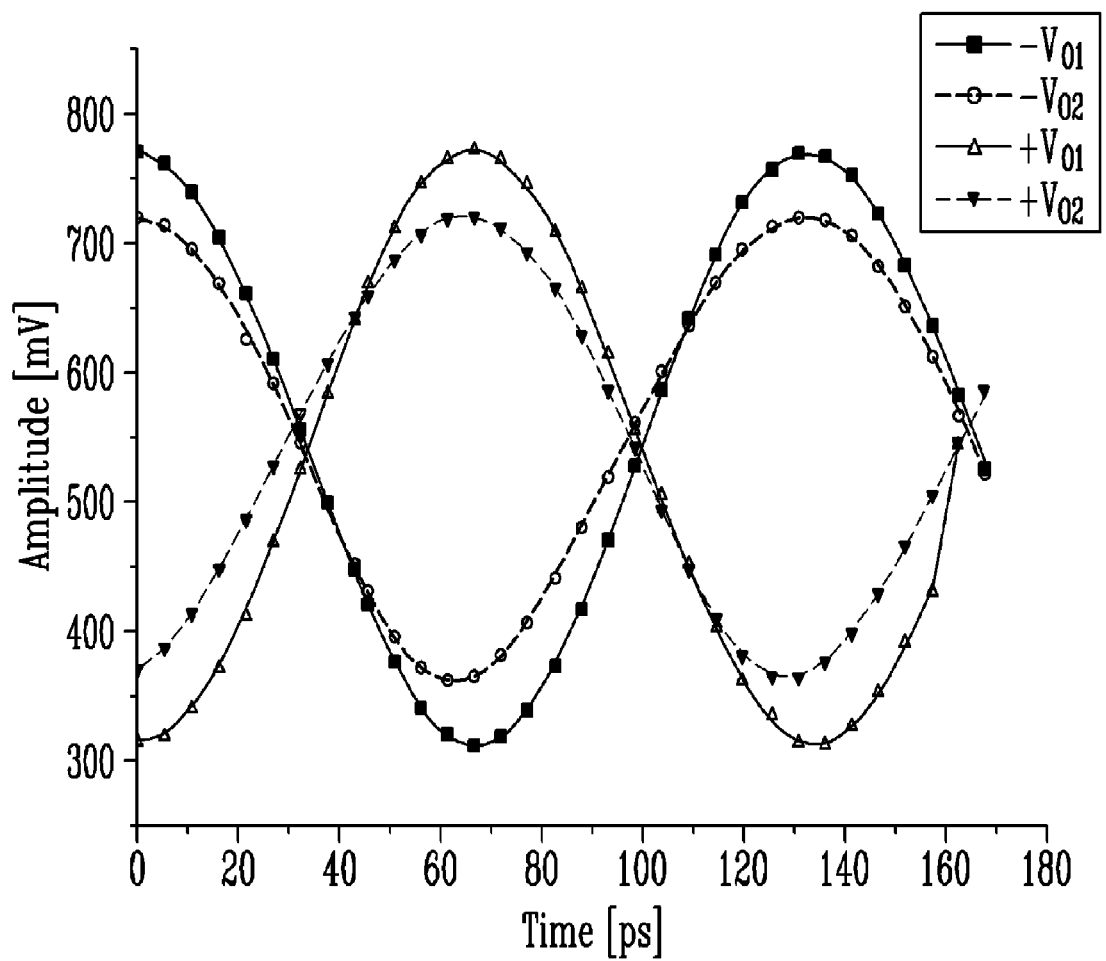
[Fig. 6]

[Fig. 7]
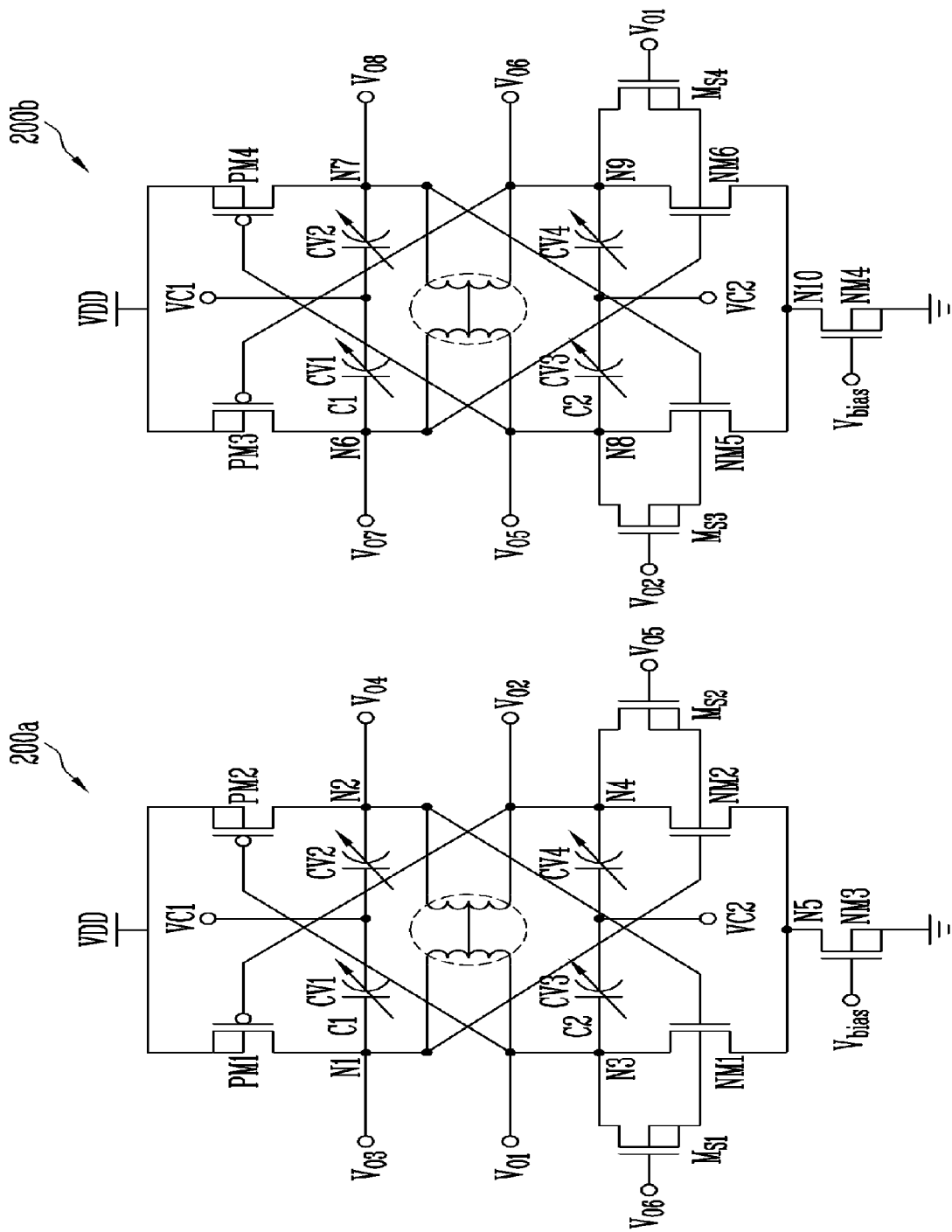

DIFFERENTIAL VCO AND QUADRATURE VCO USING CENTER-TAPPED CROSS-COUPLING OF TRANSFORMER

TECHNICAL FIELD

The present invention relates to a differential voltage-controlled oscillator (VCO) and a quadrature VCO using center-tapped cross-coupling of a transformer, and more specifically, a VCO which exhibits low-power and excellent phase noise characteristics by using center-tapped cross-coupling of a transformer, and has a wide oscillation frequency range and a linear control voltage-oscillation frequency characteristic.

This work was supported by the IT R&D program of MIC/IITA [2006-S-070-02, Development of Cognitive Wireless Home Networking System].

BACKGROUND ART

In general, a VCO is an oscillator with a variable capacitor whose capacitance is changed through voltage adjustment, to thereby adjust the frequency. Such a VCO is an essential component of all electrical communication systems and may be used for up-converting or down-converting a frequency of a predetermined signal.

FIG. 1 is a circuit diagram of a conventional LC VCO.

Referring to FIG. 1, the conventional LC VCO 100 includes an LC resonant circuit 130 which oscillates at a frequency depending on a control voltage VC, and an amplification circuit 150 which amplifies the oscillation frequency output from the LC resonant circuit 130.

In the conventional LC VCO 100 configured in such a manner, an NMOS transistor NM and a PMOS transistor PM are connected in series to both ends of an inductor L so as to form one current path. Therefore, the VCO can oscillate while reducing current consumption by one half.

In the LC VCO 100, however, since the NMOS transistor NM and the PMOS transistor PM are not exactly symmetrical with each other, an output is unbalanced. To solve this problem, a resistor Rs is connected to an output stage to equalize output levels. However, the magnitude of a supply voltage should be increased as much as a voltage drop caused by the resistor Rs.

Meanwhile, when a quadrature VCO is implemented by connecting two such LC VCOs through a switching transistor, the switching transistor is additionally connected to an oscillation load such that current consumption increases.

Further, the switching transistor and a substrate are easily coupled to each other such that a parasitic component of the substrate is directly fed-back to the oscillation load. This degrades a phase noise characteristic.

DISCLOSURE OF INVENTION

Technical Problem

In order to solve the foregoing and/or other problems, it is an objective of the present invention to provide a VCO which exhibits low-power and excellent phase noise characteristics, and has a wide oscillation frequency range and a linear control voltage-oscillation frequency characteristic.

It is another objective of the present invention to provide a quadrature VCO which has an excellent phase noise characteristic without substrate loss and current consumption caused by switching transistors.

Technical Solution

In one aspect, the present invention is directed to a differential voltage-controlled oscillator (VCO) using center-tapped cross-coupling of a transformer, the differential VCO comprising a resonant circuit including: a transformer having a primary coil connected between a first node and a third node, and a secondary coil connected between a second node and a fourth node; first and second variable capacitance units connected between a first control voltage and the first and second nodes, respectively; and third and fourth variable capacitance units connected between a second control voltage and the third and fourth nodes, respectively, wherein the resonant circuit oscillates a frequency depending on the first and second control voltages; a first amplification circuit including first and second PMOS transistors connected between a power supply and the first node and between the power supply and the second node, respectively, and differentially amplifying and outputting the oscillation frequency output from the resonant circuit; and a second amplification circuit including first and second NMOS transistors connected between the third node and a fifth node and between the fourth node and the fifth node, respectively, and differentially amplifying and outputting the oscillation frequency output from the resonant circuit.

The first NMOS transistor and the second NMOS transistor are differentially cross-coupled to the second PMOS transistor and the first PMOS transistor, respectively, through the transformer.

Here, center taps of the primary and secondary coils of the transformer may be connected to each other, and the first and second NMOS transistors and the first and second PMOS transistors may be connected in series through the center taps so as to form one current path.

The first and second variable capacitance units may have the same capacitance, and the third and fourth variable capacitance units may have the same capacitance which is different from that of the first and second variable capacitance units. That is, the first and second variable capacitance units and the third and fourth variable capacitance units may have a different frequency tuning range.

Therefore, either the pair of the first and second variable capacitance units or the pair of the third and fourth variable capacitance units may be used for coarse tuning while the other pair is used for fine tuning.

Further, each of the first to fourth variable capacitance units may be composed of a plurality of varactor diodes, and one or more resistors for distributing the first and second control voltages may be connected between the first and second variable capacitance units and between the third and fourth variable capacitance units, respectively. Therefore, when the first control voltage is applied to the first and second variable capacitance units, the first control voltage may be distributed by the resistors such that the capacitance of the first and second variable capacitance units varies linearly throughout the entire capacitance region. When the second control voltage is applied to the third and fourth variable capacitance units, the second control voltage may be distributed by the resistors such that the capacitance of the third and fourth variable capacitance units varies linearly throughout the entire capacitance region.

In another aspect, the present invention is directed to a quadrature VCO using center-tapped cross-coupling of a transformer, the quadrature VCO comprising first and second differential VCOs that are connected to each other through first to fourth switching transistors so as to output four-phase quadrature signals. The sources of the first and second switching transistors connected to the first differential VCO are connected to body gates of first and second NMOS transistors or body gates of first and second PMOS transistors composing an amplification circuit of the first differential VCO, respectively, and the sources of the third and fourth switching transistors connected to the second differential VCO are connected to body gates of first and second NMOS transistors or body gates of first and second PMOS transistors composing an amplification circuit of the second differential VCO, respectively.

ADVANTAGEOUS EFFECTS

First, the differential VCO and the quadrature VCO according to the present invention can be driven by low power through the current reuse structure.

Second, the differential VCO and the quadrature VCO according to the present invention have an excellent phase noise characteristic by center-tapped cross-coupling through the transformer.

Third, in the differential VCO and the quadrature VCO according to the present invention, the variable capacitance units for frequency variation are divided into variable capacitance units for coarse tuning and variable capacitance units for fine tuning. Therefore, it is possible to obtain a wide tuning range while a voltage oscillation gain is reduced.

Fourth, the differential VCO and the quadrature VCO according to the present invention are configured in such a manner that the respective variable capacitance units operate linearly throughout the entire capacitance region through the control voltage distribution of the resistors. Accordingly, it is possible to obtain a linear control voltage-oscillation frequency characteristic.

Fifth, the quadrature VCO according to the present invention can output four-phase quadrature signals while having an excellent phase characteristic, without substrate loss and current consumption caused by the switching transistors.

BRIEF DESCRIPTION OF THE DRAWINGS

The foregoing and other objects, features and advantages of the present invention will be apparent from the more particular description of preferred embodiments of the present invention, as illustrated in the accompanying drawings. The drawings are not necessarily to scale, emphasis instead being placed upon illustrating the principles of the present invention.

FIG. 1 is a circuit diagram of a conventional LC VCO.

FIG. 2 is a circuit diagram of a differential VCO according to the present invention.

FIG. 3 is a circuit diagram for explaining a current reuse structure of the VCO shown in FIG. 2.

FIG. 4(a) is a circuit diagram showing one or more resistors connected between first and second variable capacitance units and between third and fourth variable capacitance units, such that the variable capacitance units shown in FIG. 2 operate linearly.

FIG. 4(b) is a diagram showing a variable capacitance range of the variable capacitance units shown in FIG. 4(a).

FIG. 5 is a graph of results obtained by performing frequency tuning while adjusting the first and second control voltages in the VCO shown in FIG. 2.

FIG. 6 is a graph of simulated differential output voltage with respect to input voltage in the VCO shown in FIG. 2.

FIG. 7 is a circuit diagram of a quadrature VCO according to the present invention.

MODE FOR THE INVENTION

Hereinafter, exemplary embodiments of the present invention will be described in detail with reference to the accompanying drawings.

FIG. 2 is a circuit diagram of a differential VCO according to the present invention.

Referring to FIG. 2, the VCO 200 according to the present invention includes a resonant circuit 230 which oscillates a frequency depending on first and second control voltages VC1 and VC2 and first and second amplification circuits 250A and 250B which differentially amplify the oscillation frequency output from the resonant circuit 230.

The first amplification circuit 250A includes first and second PMOS transistors PM1 and PM2, the second amplification circuit 250B includes first and second NMOS transistors NM1 and NM2, and the resonant circuit 230 includes a transformer 231 and first to fourth variable capacitance units CV1 and CV4 connected to the transformer 231.

The connections among the components will be described in detail as follows.

The first PMOS transistor PM1 is connected between a power supply VDD and a first node N1, and the second PMOS transistor PM2 is connected between the power supply VDD and a second node N2. The first variable capacitance unit CV1 is connected between the first control voltage VC1 and the first node N1, and the second variable capacitance unit CV2 is connected between the first control voltage VC1 and the second node N2.

The first NMOS transistor NM1 is connected between a third node N3 and a fifth node N5, and the second NMOS transistor NM2 is connected between a fourth node N4 and the fifth node N5. The third variable capacitance unit CV3 is connected between the second control voltage VC2 and the third node N3, and the fourth variable capacitance unit CV4 is connected between the second control voltage VC2 and the fourth node N4. Further, a third NMOS transistor NM3 for supplying a bias current is connected between the fifth node N5 and a ground terminal GND.

The first PMOS transistor PM1 and the second PMS transistor PM2 are differentially cross-coupled to the second NMOS transistor NM2 and the first NMOS transistor NM1, respectively. This will be specifically described as follows.

The drain of the first NMOS transistor NM1 is connected to the gate of the second PMOS transistor PM2, and the drain of the second NMOS transistor NM2 is connected to the gate of the first PMOS transistor PM1. Further, the drain of the first PMOS transistor PM1 is connected to the gate of the second NMOS transistor NM2, and the drain of the second PMOS transistor PM2 is connected to the gate of the first NMOS transistor NM1.

That is, the first NMOS transistor NM1 and the second NMOS transistor NM2 are cross-coupled to the second PMOS transistor PM2 and the first PMOS transistor PM1, respectively, through the transformer 231.

Both ends of a primary coil 231a of the transformer 231 are connected between the first node N1 and the third node N3, and both ends of a secondary coil 231b of the transformer 231 are connected between the second node N2 and the fourth node N4. Further, center taps 231c of the primary and secondary coils 231a and 231b of the transformer 231 are connected to each other.

The differential VCO 200 configured in such a manner has the following features: (1) a current reuse structure is adopted in the differential VCO 200 such that the differential VCO 200 can be driven by low power, (2) an excellent phase noise characteristic can be obtained by coupling through the transformer 231, (3) a wide-band tuning range can be obtained by the variable capacitance units CV1 to CV4 which can perform coarse tuning and fine tuning, and (4) a control voltage-oscillation frequency characteristic is linear because a control voltage is distributed by resistors. These features will be described in detail as follows.

First, the differential VCO 200 according to the present invention has the same current reuse structure as the conventional LC VCO shown in FIG. 1. Therefore, the differential VCO 200 can be driven by low power.

Referring to FIG. 3, the current reuse structure will be described in more detail.

FIG. 3 is a circuit diagram for explaining the current reuse structure of the VCO shown in FIG. 2. In FIG. 3, $-g_{active}$ represents the sum of negative transconductances $[(-g_n)+(-g_p)]$ when the first and second NMOS transistors NM1 and NM2 and the first and second PMOS transistors PM1 and PM2 are connected in series.

As shown in FIG. 3, in the differential VCO according to the present invention, a first current path P1 directed to the secondary coil 231b through the center tap 231c from the primary coil 231a and a second current path P2 directed to the primary coil 231a through the center tap 231c from the secondary coil 231b are formed depending on the switching operations of the first and second NMOS transistor NM1 and NM2 and the first and second PMOS transistors PM1 and PM2.

That is, the first and second NMOS transistors NM1 and NM2 and the first and second PMOS transistors PM1 and PM2 are connected in series so as to form one current path. In such a current reuse structure, current consumption can be reduced by one half during oscillation.

Further, since the primary and second coils 231a and 231b of the transformer 231 are connected through the center tap 231c, I/Q output levels can be equalized, even though the first and second NMOS transistors NM1 and NM2 are not exactly symmetrical with the first and second PMOS transistors PM1 and PM2. Further, AC signals of the first and second current paths P1 and P2 are coupled to each other such that a quality factor and a phase noise characteristic are enhanced.

Second, the differential VCO 200 according to the present invention has a structure in which the first NMOS transistor NM1 and the second NMOS transistor NM2 are cross-coupled to the second PMOS transistor PM2 and the first PMOS transistor PM1 through the transformer 231. Accordingly, it is possible to obtain an excellent phase noise characteristic.

More specifically, as shown in FIG. 2, the drains of the first PMOS transistor PM1 and the first NMOS transistor NM1 are connected to both ends of the primary coil 231a of the transformer 231, and the drains of the second PMOS transistor PM2 and the second NMOS transistor NM2 are connected to both ends of the secondary coil 231b. As a result, the gate and drain of the first NMOS transistor NM1 are connected to the drain and gate of the second PMOS transistor PM2, respectively, and the gate and drain of the second NMOS transistor NM2 are connected to the drain and gate of the first PMOS transistor PM1, respectively, with the transformer 231 being set therebetween.

The connection structure of the first and second NMOS transistors NM1 and NM2 and the first and second PMOS transistors PM1 and PM2 may have an effect upon voltage oscillation performance. In the present invention, as the first NMOS transistor NM1 and the second NMOS transistor NM2 are cross-coupled to the second PMOS transistor PM2 and the first PMOS transistor PM1 through the transformer 231, the connection structure enhances a phase noise characteristic.

Third, the differential VCO 200 according to the present invention has a structure in which one pair of the first and second variable capacitance units CV1 and CV2 and the other pair of the third and fourth variable capacitance units CV3 and CV4 performs coarse tuning while the other pair performs fine tuning. Accordingly, while a voltage oscillation gain is reduced, a wide-band tuning range can be obtained.

More specifically, the first and second variable capacitance units CV1 and CV2 have a different capacitance from the third and fourth variable capacitance units CV3 and CV4. Therefore, when the capacitance C1 of the first and second variable capacitance units CV1 and CV2 is adjusted to perform coarse tuning and the capacitance C2 of the third and fourth variable capacitance units CV3 and CV4 is adjusted to perform fine tuning, it is possible to obtain a wide-band tuning range while a voltage oscillation gain is reduced.

Here, it is preferable that the first and second variable capacitance units CV1 and CV2 have the same capacitance, and the third and fourth variable capacitance units CV3 and CV4 have the same capacitance. Further, as described above, one pair of the variable capacitance units is used for coarse tuning while the other pair of the variable capacitance units is used for fine tuning.

Fourth, a control voltage-oscillation frequency characteristic of the differential VCO 200 according to the present invention is linear.

In a typical VCO, a variable capacitance unit is composed of a varactor diode. However, the varactor diode locally has a nonlinear characteristic in a variable capacitance region such that voltage oscillation gain is not constant.

To solve this problem, one or more resistors are connected between the first and second variable capacitance units CV1 and CV2 and between the third and fourth variable capacitance units CV3 and CV4 such that the nonlinear characteristic of the first to fourth variable capacitance units CV1 to CV4 is linearized. This will be described in detail with reference to FIGS. 4(a) and 4(b).

FIG. 4(a) is a circuit diagram showing a structure in which one or more resistors are connected between the first and second variable capacitance units CV1 and CV2 and between the third and fourth variable capacitance units CV3 and CV4, such that the variable capacitance units shown in FIG. 2 operate linearly. FIG. 4(b) is a diagram showing a variable capacitance range of the variable capacitance units shown in FIG. 4(a).

Referring to FIG. 4(a), each of the first to fourth variable capacitance units CV1 to CV4 is composed of three-staged varactor diodes C0 which are each connected to a resistor R.

In the respective varactor diodes C0, a change in capacitance with respect to a control voltage VC of 0~Vc is nonlinear. However, when the resistors R are connected to the respective varactor diodes C0 as shown in FIG. 4(a) and a control voltage Vc is applied, the control voltage Vc is distributed across the resistors R.

Accordingly, as shown in FIG. 4(b), a capacitance range which is varied in each of the varactor diodes C0 differs. The capacitance range which is finally varied is (Ca+Cb)~(Ca+Cb+Cc). Therefore, since the capacitance which is actually varied is Cc, it can be found that the overall change in capacitance is linear.

That is, the capacitance change of the first to fourth variable capacitance units CV1 to CV4 is linearized by the control voltage distribution through the resistors. Accordingly, it is possible to obtain a linear control voltage-oscillation frequency characteristic.

In this embodiment, the variable capacitance range is divided into three parts by using three-staged varactor diodes. However, the variable capacitance range can be further divided by using a larger number of varactor diodes. In this case, as the variable capacitance range is further divided, the entire variable capacitance range may decrease, so that a frequency tuning range is likely to decrease. Therefore, it is preferable that the variable capacitance range is divided only to such a degree that the frequency tuning range does not decrease.

FIG. 5 is a graph of results obtained by performing frequency tuning while adjusting the first and second control voltages CV1 and CV2 in the VCO shown in FIG. 2.

As shown in FIG. 5, when the second control voltage VC2 of the third and fourth variable capacitance units CV3 and CV4 was controlled to perform fine tuning while the first control voltage VC1 of the first and second variable capacitance units CV1 and CV2 for coarse tuning was varied in 0.2V steps, the differential VCO had a wide-band characteristic where the oscillation frequency range was more than 1.5 GHz.

FIG. 6 is a graph showing a simulation result of output voltages at four output nodes N1 to N4 in the differential VCO shown in FIG. 2.

Referring to FIG. 6, it can be found that first differential output voltages $+V_{O1}$ and $-V_{O1}$ output from the amplification circuit 250B have a different amplitude from second differential output voltages $+V_{O2}$ and $-V_{O2}$ output from the amplification circuit 250A. Such a difference in amplitude is caused by a difference in capacitance between the variable capacitance units connected to the respective output terminals. As the capacitance of a variable capacitance unit connected to an output terminal increases, the amplitude of an output voltage increases. As the capacitance decreases, the amplitude of an output voltage decreases.

Further, it can be found that the first negative differential output voltage $-V_{O1}$ has a different phase from the second negative differential output voltage $-V_{O2}$, and the first positive differential output voltage $+V_{O1}$ has a different phase from the second positive differential output voltage $+V_{O2}$. Such a phase difference is caused by coupling through the transformer 231. That is, the phase difference can be adjusted through coupling by the transformer 231.

Therefore, between the first differential output voltages $+V_{O1}$ and $-V_{O1}$ and the second differential output voltages $+V_{O2}$ and $-V_{O2}$ output from the differential VCO, any one pair of output voltages having a desirable magnitude and phase may be selected.

Meanwhile, when two VCOs are connected through switching transistors so as to implement a quadrature VCO, current consumption may increase due to the switching transistors, and substrate loss (phase noise) may occur.

To solve this problem, a quadrature VCO is configured which can output a quadrature signal without substrate loss and current consumption caused by switching transistors. This will be described in more detail with reference to FIG. 7.

FIG. 7 is a circuit diagram of a quadrature VCO according to the present invention.

Referring to FIG. 7, the quadrature VCO according to the present invention has a structure in which first and second VCOs 200a and 200b are connected through first to fourth switching transistors $M_{S1}$ to $M_{S4}$. The first and second VCOs 200a and 200b have the same configuration as the VCO shown in FIG. 2.

In the first VCO 200a, the sources of the first and second switching transistors $M_{S1}$ and $M_{S2}$ are connected to body gates of first and second NMOS transistors NM1 and NM2, respectively. Similarly, in the second VCO 200b, the sources of the third and fourth switching transistors $M_{S3}$ and $M_{S4}$ are connected to body gates of fifth and sixth NMOS transistors NM5 and NM6, respectively.

In such a connection structure, a current does not flow in the first to fourth switching transistors $M_{S1}$ to $M_{S4}$, which makes it possible to reduce current consumption. Further, since the first to fourth switching transistors $M_{S1}$ to $M_{S4}$ are not coupled to a substrate, it is possible to obtain four-phase quadrature signals without phase noise caused by a parasitic component of the substrate.

In this embodiment, the quadrature VCO using coupling of the transformer 231 has been taken as an example. However, the connection structure of the switching transistors can also be applied to the conventional quadrature VCO using an inductor.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

The invention claimed is:

1. A differential voltage-controlled oscillator (VCO) using center-tapped cross-coupling of a transformer, comprising:
   a resonant circuit including:
      a transformer having a primary coil connected between a first node and a third node, and a secondary coil connected between a second node and a fourth node;
      first and second variable capacitance units connected between a first control voltage and the first and second nodes, respectively; and
      third and fourth variable capacitance units connected between a second control voltage and the third and fourth nodes, respectively,
      wherein the resonant circuit oscillates a frequency depending on the first and second control voltages;
   a first amplification circuit including first and second PMOS transistors connected between a power supply and the first node and between the power supply and the second node, respectively, and differentially amplifying and outputting the oscillation frequency output from the resonant circuit; and
   a second amplification circuit including first and second NMOS transistors connected between the third node and a fifth node and between the fourth node and the fifth node, respectively, and differentially amplifying and outputting the oscillation frequency output from the resonant circuit,
   wherein the first NMOS transistor and the second NMOS transistor are differentially cross-coupled to the second PMOS transistor and the first PMOS transistor, respectively, through the transformer.

2. The differential VCO according to claim 1, wherein the gate and drain of the first NMOS transistor are connected to the drain and gate of the second PMOS transistor, respectively.

3. The differential VCO according to claim 1, wherein the gate and drain of the second NMOS transistor are connected to the drain and gate of the first PMOS transistor, respectively.

4. The differential VCO according to claim 1, wherein center taps of the primary and secondary coils of the transformer are connected to each other.

5. The differential VCO according to claim 4, wherein the first and second NMOS transistors and the first and second PMOS transistors are connected in series through the center taps so as to form one current path.

6. The differential VCO according to claim 1, wherein the amplitudes and phases of differential output voltages output from the first and second nodes are the same, and the amplitudes and phases of differential output voltages output from the third and fourth nodes are the same.

7. The differential VCO according to claim 1, wherein the phases of differential output voltages output from the first and second nodes and the phases of differential output voltages output from the third and fourth nodes are adjusted by coupling adjustment of the transformer.

8. The differential VCO according to claim 1, wherein the first and second variable capacitance units have the same capacitance, and the third and fourth variable capacitance units have the same capacitance which is different from that of the first and second variable capacitance units.

9. The differential VCO according to claim 1, wherein the first and second variable capacitance units have a different frequency tuning range from the third and fourth variable capacitance units, such that the first and second variable capacitance units are used for coarse tuning and the third and fourth variable capacitance units are used for fine tuning.

10. The differential VCO according to claim 1, wherein the first and second variable capacitance units have a different frequency tuning range from the third and fourth variable capacitance units, such that the first and second variable capacitance units are used for fine tuning and the third and fourth variable capacitance units are used for coarse tuning.

11. The differential VCO according to claim 1, wherein each of the first to fourth variable capacitance units is composed of a plurality of varactor diodes, and one or more resistors for distributing the first and second control voltages are connected between the first and second variable capacitance units and between the third and fourth variable capacitance units, respectively.

12. The differential VCO according to claim 11, wherein when the first control voltage is applied to the first and second variable capacitance units, the first control voltage is distributed by the resistors such that the capacitance of the first and second variable capacitance units varies linearly throughout the entire capacitance region, and when the second control voltage is applied to the third and fourth variable capacitance units, the second control voltage is distributed by the resistors such that the capacitance of the third and fourth variable capacitance units varies linearly throughout the entire capacitance region.

13. The differential VCO according to claim 1, wherein a third NMOS transistor for supplying a bias current is connected between the fifth node and a ground terminal.

14. A quadrature VCO using center-tapped cross-coupling of a transformer, comprising:
  first and second differential VCOs that are connected to each other through first to fourth switching transistors so as to output four-phase quadrature signals, wherein
    the sources of the first and second switching transistors connected to the first differential VCO are connected to body gates of first and second NMOS transistors or body gates of first and second PMOS transistors composing an amplification circuit of the first differential VCO, respectively, and
    the sources of the third and fourth switching transistors connected to the second differential VCO are connected to body gates of first and second NMOS transistors or body gates of first and second PMOS transistors composing an amplification circuit of the second differential VCO, respectively
  wherein a primary coil of the transformer is connected to a secondary coil of the transformer through a center tap, the center tap not being grounded.

15. A quadrature VCO, using center-tapped cross-coupling of a transformer, comprising:
  first and second differential VCOs that are connected to each other through first to fourth switching transistors so as to output four-phase quadrature signals, wherein
    the sources of the first and second switching transistors connected to the first differential VCO are connected to body gates of first and second NMOS transistors or body gates of first and second PMOS transistors composing an amplification circuit of the first differential VCO, respectively, and
  the sources of the third and fourth switching transistors connected to the second differential VCO are connected to body gates of first and second NMOS transistors or body gates of first and second PMOS transistors composing an amplification circuit of the second differential VCO, respectively
  wherein each of the first and second differential VCOs comprises:
  a resonant circuit including:
    a transformer having a primary coil connected between a first node and a third node, and a secondary coil connected between a second node and a fourth node;
    first and second variable capacitance units connected between a first control voltage and the first and second nodes, respectively; and
    third and fourth variable capacitance units connected between a second control voltage and the third and fourth nodes, respectively, wherein
    the resonant circuit oscillates a frequency depending on the first and second control voltages;
  a first amplification circuit including first and second PMOS transistors connected between a power supply and the first node and between the power supply and the second node, respectively, and differentially amplifying and outputting the oscillation frequency output from the resonant circuit; and
  a second amplification circuit including first and second NMOS transistors connected between the third node and a fifth node and between the fourth node and the fifth node, respectively, and differentially amplifying and outputting the oscillation frequency output from the resonant circuit,
  wherein the first NMOS transistor and the second NMOS transistor are differentially cross-coupled to the second PMOS transistor and the first PMOS transistor, respectively, through the transformer.

* * * * *